United States Patent
Pikelja et al.

(10) Patent No.: US 6,781,379 B2
(45) Date of Patent: Aug. 24, 2004

(54) CABLE ROUTING AND POTENTIAL EQUALIZING RING FOR MAGNETIC RESONANCE IMAGING COILS

(75) Inventors: Velibor Pikelja, Milwaukee, WI (US); Derek Seeber, Wauwatosa, WI (US); Jovan Jevtic, West Allis, WI (US); Ashok Menon, Milwaukee, WI (US); William T. Johnson, Jr., Milwaukee, WI (US)

(73) Assignee: IGC-Medical Advances, Inc., Milwaukee, WI (US)

( * ) Notice: Subject to any disclaimer, the term of this patent is extended or adjusted under 35 U.S.C. 154(b) by 0 days.

(21) Appl. No.: 10/227,072

(22) Filed: Aug. 22, 2002

(65) Prior Publication Data

US 2004/0036473 A1 Feb. 26, 2004

(51) Int. Cl.[7] .................................................. G01V 3/00
(52) U.S. Cl. ........................................ 324/320; 324/318
(58) Field of Search ................................. 324/320, 319, 324/318, 322, 309, 321; 335/299, 216, 298; 128/653.5

(56) References Cited

U.S. PATENT DOCUMENTS

| | | | | | |
|---|---|---|---|---|---|
| 4,686,473 A | * | 8/1987 | Chesneau et al. | ........... | 324/320 |
| 4,707,662 A | * | 11/1987 | Kenner et al. | ............. | 324/318 |
| 4,910,461 A | * | 3/1990 | Van Vaals | .................. | 324/318 |
| 6,011,395 A | * | 1/2000 | Leifer | ......................... | 324/318 |
| 6,040,697 A | * | 3/2000 | Misic | .......................... | 324/318 |

* cited by examiner

*Primary Examiner*—Brij B Shrivastav
(74) *Attorney, Agent, or Firm*—Quarles & Brady LLP

(57) ABSTRACT

A cable routing system for an MRI coil having multiple loops and multiple signal cables provides a non-resonant conductive ring surrounding the loops and grounded to define a low electrical field region along which the signal cables may be routed for reduced interference.

22 Claims, 1 Drawing Sheet

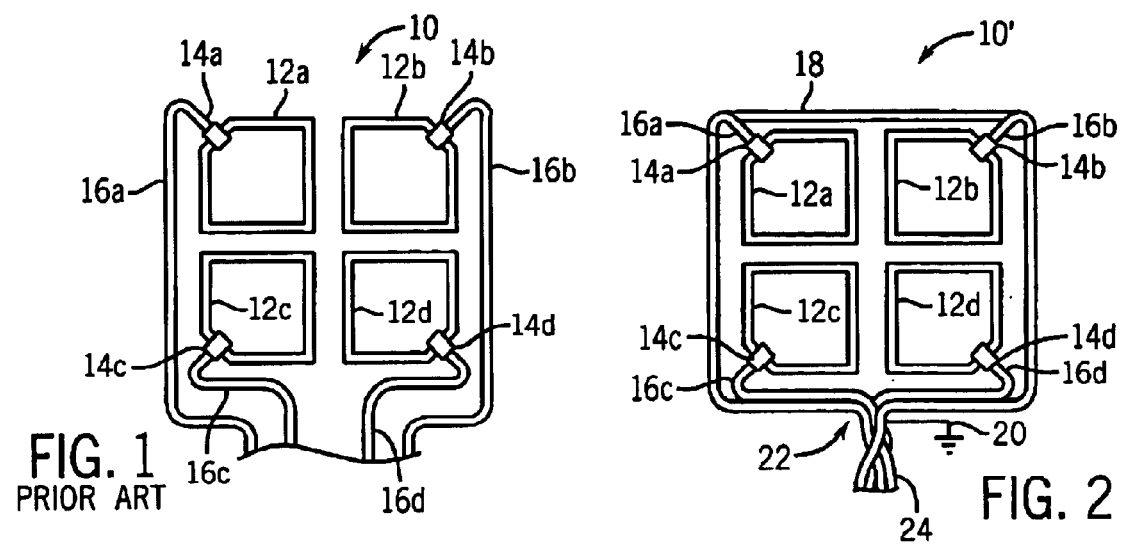
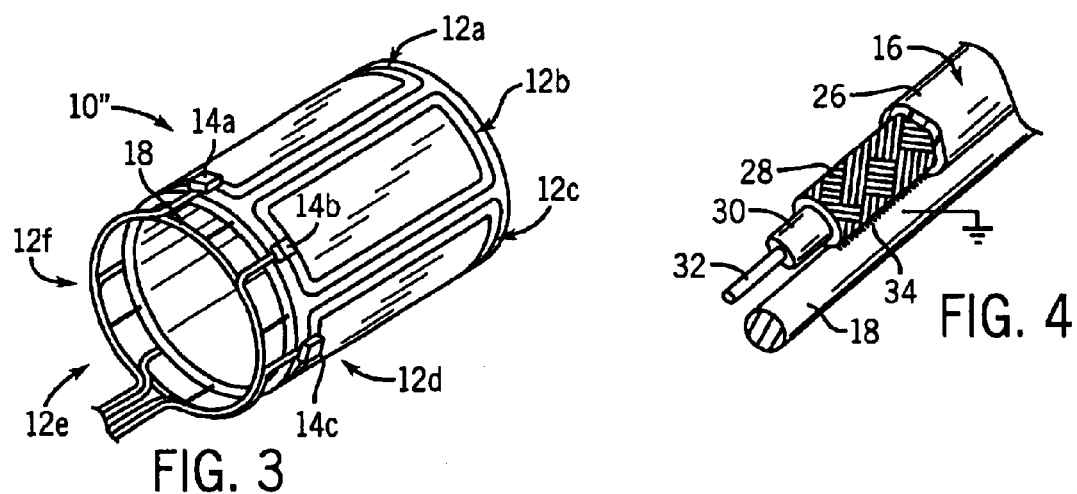
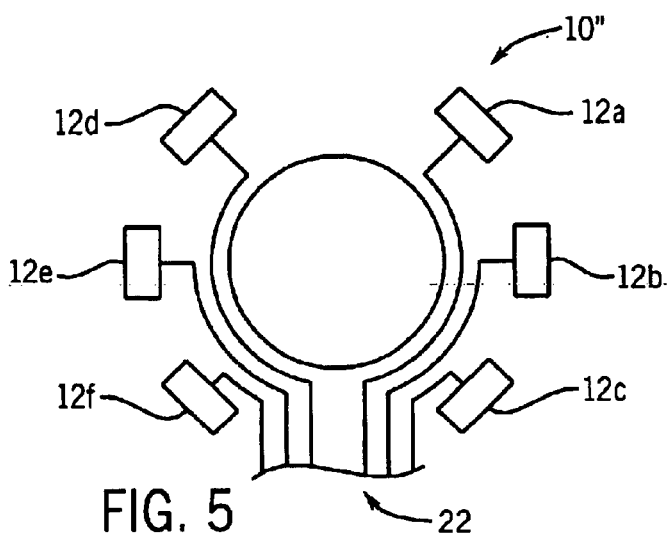

CABLE ROUTING AND POTENTIAL EQUALIZING RING FOR MAGNETIC RESONANCE IMAGING COILS

CROSS-REFERENCE TO RELATED APPLICATIONS

STATEMENT REGARDING FEDERALLY SPONSORED RESEARCH OR DEVELOPMENT

BACKGROUND OF THE INVENTION

Magnetic resonance imaging (MRI) is used to generate medical diagnostic images by measuring faint radio frequency signals (magnetic resonance) emitted from atomic nuclei of tissue (for example, hydrogen atoms in water molecules) in the presence of a strong magnetic field after radio frequency stimulation.

The radio frequency stimulation may be applied, and the resulting resonance signal detected with a "local coil" having one or more "loops" serving as antennas. The loops of the local coil are tuned to a narrow band (e.g., 64 megahertz for a one and one half Tesla magnetic field strength) and adapted to be placed near or on the patient to decrease the effects of external electrical noise on the detected signal. The detected signal may be conducted through one or more signal cables to the MRI system for processing. Signals from multiple loops may be combined prior to being processed by the MRI system, for example, as in a quadrature-type coil where perpendicular loops are combined with a ninety degree phase shift, or the signals may be conducted independently to the MRI system to provide for so-called phased array operation.

The low strength of the detected resonance signals requires that the signal cables be shielded from external radio frequency interference. This interference may come from the external hospital environment, the gradient coils of the MRI machine, or from other loops of the local coil itself. Particularly, for phased array operation, it is important that the signals of each loop of the local coils be kept isolated from the signals from the other loops.

Cross-coupling of the signals between adjacent loops can be minimized by careful routing of the signal cables along regions of low electrical field strength about the coil. Unfortunately, the regions of low electrical field strength may shift during use of the coil or be difficult to determine, or may be in areas where the routing of cables is undesirable, interfering with patient access or the like, or unnecessarily increasing cable length and contributing to signal loss.

BRIEF SUMMARY OF THE INVENTION

The present invention provides a method of routing signal cables along low electrical field strength areas of a local coil in a predictable and reliable manner. The invention introduces a conductive ring into proximity with the coil loops and the ring is grounded thus creating a low electrical field strength area. The signal cables are attached to the conductor of the ring to run along the ring to a point where they exit together as a unified cable. The ring, by defining an area of low electromagnetic field, reduces interference on the cables.

One object of the invention is to provide for a method of extracting signals from multiple loop coils, such as phased array coils, while minimizing the electric interference among the signals.

It is another object of the invention to allow the convenient routing of the cables so as not to interfere with use of the coil. The ring allows the routing path to be flexibly selected.

It is yet another object of the invention to allow multiple cables from each coil to be collected into a single cable without unduly increasing the electrical interference received by those cables that must have a longer path length.

It is a further object of the invention to equalize the potential in the vicinity of the ring.

The signal cables may be shielded cables having an outer shield surrounding an inner conductor and the outer shields may be electrically connected to the conductive ring. Thus, it is another object of the invention to provide a simple method of grounding the ring.

The conductive ring may be substantially parallel and co-planar with the loops, for example, when the loops define a plane or surface, or the conductive ring may be substantially perpendicular to the loops, or when the loops define the surface of a cylinder with the conductive ring forming a base of the cylinder.

Thus, it is another object of the invention to provide a coil routing system adaptable to common coil designs.

The loops may be symmetric with the respect to the conductive ring and therefore another object of the invention may be to provide a conductive ring orientation that reduces net current flow in the ring, therefore reducing current flow in the shields of the cables attached to the ring.

The foregoing objects and advantages may not apply to all embodiments of the inventions as claimed and are not intended to define the scope of the invention, for which purpose claims are provided. In the following description, reference is made to the accompanying drawings, which form a part hereof, and in which there is shown by way of illustration, a preferred embodiment of the invention. Such embodiment also does not define the scope of the invention and reference must be made therefore to the claims for this purpose.

BRIEF DESCRIPTION OF THE FIGURES

FIG. 1 is a plan view of a simplified planar coil showing four coil loops, each having a separate signal cable routed according to the prior art;

FIG. 2 is a figure similar to that of FIG. 1 showing the coil employing the routing system of the present invention where the signal cables are attached to a conductive ring symmetrically surrounding the four coil loops;

FIG. 3 is a perspective view of a cylindrical coil in which the coil loops are arranged around the circumference of a cylinder and showing the positioning of a conductive ring at a base of that cylinder for receiving signal cables from each of the coil loops;

FIG. 4 is a perspective, cut-away view of a signal cable having its shield attached to the conductive ring; and FIG. 5 is a simplified diagrammatic view of the coil of FIG. 3 showing the path of routing of each of the signal cables from the coils along the conductive ring to a common cabling point.

DETAILED DESCRIPTION OF THE PREFERRED EMBODIMENT

Referring now to FIG. 1, an example prior art planar local coil 10 includes four generally rectangular loops, 12a through 12d, arranged in two rows and columns. A coupling network, 14a through 14d, of a type well known in the art, connects to the outer corners of each of the loops 12a through 12d to corresponding signal cables 16a through 16d providing a path for the introduction of a radio frequency signal into the loops 12a through 12d, or the receipt of a magnetic resonance signal from each of the loops, 14a and 14d, respectively. Generally, signal cables 16a through 16d will be shielded cables but, nevertheless, will be susceptible to interference from external electromagnetic fields in the vicinity of the loops 12a through 12d.

Referring now to FIG. 2, in the present invention, a conductive ring 18, encircles the loops 12a through 12d of coil 10', the conductive ring 18 being formed of, for example, a continuous loop of copper conductor or a loop broken with capacitances allowing conduction of radio frequency signals like an unbroken conductor but the suppression of eddy currents. The capacitances may be discrete capacitors or small gaps in the ring. As shown, the conductive ring 18 may be substantially square conforming to the collective periphery of loops 12a through 12d with rounded corners providing a smoother path for routing, as will be described.

Generally, the conductive ring 18 is substantially non-resonant at the frequencies associated with the MRI machine and/or environmental interference (i.e. radio frequencies).

In this example, the conductive ring 18 is placed so as to be generally symmetrical with respect to the structure formed by the loops 12a through 12d. The conductive ring 18 may be substantially co-planar with the structure formed by the loops 12a through 12d. These conditions are preferable but not necessary. The conductive ring 18 may be flexible or rigid. When flexible, for example, the conductive ring 18 may be constructed of a strip of copper foil, PCB board, or braided wire material.

The conductive ring 18 may be grounded through one or more ground connection of the cables 16 to a signal ground defined with respect to the receiving MRI device. Each of the cables, 16a through 16d, is then routed to the conductive ring 18 along a short path ideally at an estimated low electric field location. The cables 16a through 16d closely follow around the rim of the conductive ring 18 taking advantage of a low electric field enforced by the presence of the conductive ring 18 and its grounding. It will be understood that the conductive ring 18 provides ground with respect to the frequencies of the MRI system and/or the electrical interference and need not necessarily provide a path of DC current flow to ground or be at the same DC potential as ground.

Each of the cables 16a through 16d then proceed to a common bundling point 22, in either a clockwise or counter clockwise direction so as to reduce their total length. At the bundling point 22, the cables 16a through 16d may be collected into a common cable 24 which may be sheathed and passed to the MRI system (not shown) for processing.

Referring now to FIG. 4, the cables 16 may be shielded co-axial cables as are well known in the art and which have an outer insulating jacket 26 surrounding a conductive shield 28 which in turn fits over an insulating dielectric 30 surrounding a central coaxial conductor 32. At points along the length of the cables 16a through 16d, a portion of the outer insulating jacket 26 may be removed to expose the conductive shield 28 which may be soldered or otherwise attached, as indicated at junction 34, to the conductor of the conductive ring 18. This provides a convenient method of bringing the conductive ring 18 to signal ground without the need for a separate ground connection 20 and ensures a low impedance between the conductive ring 18 and the conductive shield 28.

Referring now to FIG. 3, an alternative cylindrical design for a coil 10", six loops 12a through 12f may be arranged along the surface of a cylinder. In this case, the loops 12a through 12f are generally rectangular, having two opposing sides of each rectangle parallel to the axis of the cylinder and two sides extending circumferentially around that axis. A conductive ring 18 may be positioned parallel to one base of the defined cylinder and the networks 14a through 14f may be positioned adjacent to that base. In this manner, short axial runs of signal cables 16a through 16f allow the signal cables 16a through 16f to reach the conductive ring 18 and thereafter pass circumferentially around the conductive ring 18 in the ring-defined region of low electric field.

As shown in FIG. 5, the signal cables 16a through 16f desirably follow the shortest possible path to a common bundling point 22 after which they are collected and cabled to the MRI system. An alternative use of the conductive ring 16 is to provide a connection of ground points of the loops 12. In this application, the cable 16 may, but need not be attached to the conductive ring 16.

It is specifically intended that the present invention not be limited to the embodiments and illustrations contained herein, but include modified forms of those embodiments including portions of the embodiments and combinations of elements of different embodiments as come within the scope of the following claims. For example, the invention is not limited to the two types of coils shown but may be applied according the above teachings to a number of different coil designs.

We claim:

1. A coil assembly for use with magnetic resonance imaging comprising:

a plurality of coil loops positionable near an imaging volume to receive magnetic resonance radio frequency signals;

a conductive ring proximate to the coil loops providing a region of low electrical field strength; and signal cables electrically communicating with the coil loops for conducting radio frequency signals, the signal cables extending from the coil loops to the conductive ring to follow the conductive ring within the region of low electrical field strength to a cable exit location; wherein the plurality of coil loops provide a phased array coil, each loop providing a separate radio frequency signal to a separate signal cable.

2. The coil assembly of claim 1 wherein the conductive ring is non-resonant at radio frequencies.

3. The coil assembly of claim 1 wherein the conductive ring is broken by series capacitances.

4. The coil assembly of claim 1 wherein the signal cables are bundled together at the cable exit position to extend away from the coil loops.

5. The coil assembly of claim 1 including means for attaching the conductive ring to a signal ground.

6. The coil assembly of claim 1 wherein the signal cables are shielded cables having an outer shield surrounding an inner conductor and wherein the outer shields are electrically connected to the conductive ring.

7. The coil assembly of claim 1 wherein the conductive ring is symmetric about the coil loops.

8. The coil assembly of claim 1 wherein the conductive ring is substantially parallel to the coil loops.

9. The coil assembly of claim 1 wherein the conductive ring is substantially perpendicular to the coil loops.

10. The coil assembly of claim 1 wherein the coil loops define a circumferential surface of a cylindrical volume and the conductive ring abuts a base of the cylindrical volume.

11. The coil assembly of claim 1 wherein the coil loops define a generally planar surface and the conductive ring is coplanar surrounding the coil loops.

12. A method of routing signal cables from a coil assembly for use with magnetic resonance imaging, the coil including a plurality of coil loops positionable near an imaging volume to receive resonance signals, the method comprising the steps of:
   (a) locating a conductive ring proximate to the coil loops to establish a region of low electrical field strength; and
   (b) routing signal cables electrically communicating with the coil loops, from the coil loops to the conductive ring to follow the conductive ring within the region of low electrical field strength to a cable exit location; wherein the plurality of coil loops provide a phased array coil, each loop producing an independent radio frequency signal on a separate signal cable.

13. The method of claim 12 wherein the conductive ring is non-resonant at radio frequencies.

14. The method of claim 12 wherein the signal cables are bundled together at the cable exit position to extend away from the coil loops.

15. The method of claim 12 including the step of bundling the signal cables together at the cable exit position to extend away from the coil loops.

16. The method of claim 12 including the step of attaching the conductive ring to a signal ground.

17. The method of claim 12 wherein the signal cables are shielded cables having an outer shield surrounding an inner conductor and including the step of attaching the outer shields electrically to the conductive ring.

18. The method of claim 12 wherein the conductive ring is located symmetrically about the coil loops.

19. The method of claim 12 wherein the conductive ring is located to be substantially parallel to the coil loops.

20. The method of claim 12 wherein the conductive ring is located to be substantially perpendicular to the coil loops.

21. The method of claim 12 wherein the coil loops define the surface of a cylinder and the conductive ring is located to form a base of the cylinder.

22. The method of claim 12 wherein the coil loops define a generally planar surface and the conductive ring is located to be coplanar surrounding the coil loops.

* * * * *